United States Patent [19]
Cho et al.

[11] Patent Number: 5,578,825
[45] Date of Patent: Nov. 26, 1996

[54] INFRARED RAY SENSOR DRIVING CIRCUIT

[75] Inventors: Sung M. Cho, Kyungki-Do; Jun R. Choi, Seoul, both of Rep. of Korea

[73] Assignee: Goldstar Co., Ltd., Seoul, Rep. of Korea

[21] Appl. No.: 357,879

[22] Filed: Dec. 16, 1994

[30] Foreign Application Priority Data

Dec. 18, 1993 [KR] Rep. of Korea ............... 28512/1993

[51] Int. Cl.[6] ......................................... G01J 5/10
[52] U.S. Cl. ............... 250/338.1; 250/342; 250/DIG. 1
[58] Field of Search ........................... 250/338.1, 338.3, 250/DIG. 1, 342

[56] References Cited

U.S. PATENT DOCUMENTS 3,792,272  2/1974  Harte et al. ..................... 250/338.1
3,988,726 10/1976  Reiss et al. ..................... 250/338.1

FOREIGN PATENT DOCUMENTS 3-269390 11/1991  Japan .......................... 250/338.3
4-164217  6/1992  Japan .......................... 250/338.3

Primary Examiner—Carolyn E. Fields

[57] ABSTRACT

An improved infrared ray sensor driving circuit capable of advantageously controlling an amplifying level and a cut-off frequency of a filter by separating the functions of an amplifier and a filter, respectively. The circuit includes an impedance matching circuit for converting a high impedance of the signals detected to a low impedance signal, a first amplifying circuit for amplifying signals outputted from the impedance matching circuit by a first predetermined gain, a filtering circuit for filtering the signals outputted from the first amplifying circuit to pass frequencies of a predetermined bandwidth, and a second amplifying circuit for amplifying the signals outputted from the filtering circuit by a second predetermined gain.

9 Claims, 3 Drawing Sheets

INFRARED RAY SENSOR DRIVING CIRCUIT

BACKGROUND OF THE INVENTION

1. Field of the Invention

The present invention relates to an infrared ray sensor driving circuit, and particularly to an improved infrared ray sensor driving circuit capable of advantageously controlling an amplifying level and a cut-off frequency of a filter by separating the functions of an amplifier and a filter, respectively.

2. Description of the Conventional Art

Referring to FIG. 1, there is shown a first conventional infrared ray sensor driving circuit. As shown therein, the conventional circuit includes an impedance matching stage 1 for matching the output impedance of the signals of the infrared ray generated from a human body with an input impedance of the infrared ray sensor driving circuit, a first amplifying stage 2 for filtering the signals outputted from the impedance matching stage 1 and for amplifying the filtered signals by a predetermined amount, and a second amplifying stage 3 for filtering the signals outputted from the first amplifying stage 2 and for amplifying the filtered signals by a predetermined amount.

Here, in the impedance matching stage 1, series-connected condensers C1 and C2 are connected in parallel with a resistor R1 between a gate of a field effect transistor FET and ground. The supply voltage VDD is applied to a drain of the field effect transistor FET, and a condenser C3 is connected to the drain of the field effect transistor FET, and a resistor R2 is connected between the source terminal of the field effect transistor FET and ground.

In the first amplifying stage 2, the source of the field effect transistor FET of the impedance matching stage 1 is connected to a non-inverting input terminal (+) of a first amplifier OP1, and a condenser C5 and a resistor R4 in parallel are connected between an output terminal of first amplifier OP1 and an inverting input terminal (−) thereof, and a resistor R3 in series with a condenser C4 are connected between the inverting input terminal (−) of first amplifier OP1 and ground.

In the second amplifying stage 3, the output terminal of the first amplifier OP1 of the first amplifying stage 2 is connected to a non-inverting input terminal (+) of a second amplifier OP2, and a resistor R6 and a condenser C7 are connected in parallel between an output terminal of the second amplifier OP2 and an inverting input terminal (−) thereof, and a resistor R5 in series with a condenser C6 are connected between the inverting input terminal (−) of second amplifier OP2 and ground.

Referring to FIG. 2, shown therein is a second conventional infrared ray sensor driving circuit which includes an impedance matching stage 1' for matching the output impedance of the signals detected from the infrared ray generated from a human body with the input impedance of the infrared ray sensor driving circuit, a first amplifying stage 2' for filtering the signals outputted from the impedance matching stage 1' and for amplifying the filtered signals by a predetermined amount, a second amplifying stage 3' consisting of a second amplifier OP2, diodes D1 and D2, condensers C7 and C9 and resistors R5, R6, R12, and R13, for filtering the signals outputted from the first amplifying stage 2' and for amplifying the filtered signals by a predetermined amount, a comparator stage 4 consisting of first and second comparators CP1 and CP2 and diodes D3 and D4, for comparing the level of the signal outputted from the second amplifying stage 3' and the value of the supply voltage VDD, a pulse generating stage 5 for generating pulses in accordance with the signals outputted from the comparator stage 4, and a relay driving stage 7 consisting of a transistor Q1 and resistors R9 and R10 for driving a relay 6 in accordance with the pulses outputted from the pulse generating stage 5.

Referring to FIG. 2, the detailed operation of the second conventional infrared ray sensor driving circuit will now be explained.

To begin with, the infrared ray sensor 1a, which detects the infrared ray generated from a human body, requires the impedance matching stage 1 in order to convert the impedance of the detection signals through the field effect transistor. Here, since the output impedance of the infrared ray sensor 1a is relatively high and the level of the detected signals is weak, the impedance of the signals outputted from the infrared ray sensor 1a is converted.

Thereafter, the signals converted in impedance from the infrared ray sensor 1a are applied to the non-inverting terminal (+) of a first amplifier OP1 of the first amplifying stage 2' from the source of the field effect transistor.

In addition, the first amplifier OP1 in the first amplifying stage 2' non-invertingly amplifies and filters the signal applied thereto by a predetermined amount of $1+[(\omega C4 \cdot R4)/(1+\omega C4 \cdot R3)(1-\omega C5 \cdot R4)]$, and then the amplified and filtered signal is applied via condensers C9 and resistor R5 to the inverting input terminal (−) of the second amplifier OP2 in the second amplifying stage 3' from the output terminals of the first amplifier OP1.

The second amplifier OP2 invertingly amplifies and filters the inputted signal by a predetermined amount of $1+[(\omega C9 \cdot R6)/(1+\omega C9 \cdot R5)(1-\omega C7 \cdot R6)]$ as the signal is applied to the inverting input terminal (−) of the second amplifier OP2, and the amplified and filtered signal is outputted through the output terminal of the second amplifier OP2 and applied to the non-inverting input terminal (+) of the first comparator CP1 and the inverting input terminal (−) of the second comparator CP2, respectively in the comparator stage 4.

Thereafter, the first comparator CP1 in the comparator stage 4 compares the value of the signal received at its non-inverting input terminal (+) with the voltage dropped from supply voltage VDD across the resistor R12 and applied to its inverting input (−) and outputs the compared value to the anode of the diode D3.

Meanwhile, the second comparator CP2 of the comparator stage 4 compares the value of the signal received at its inverting input terminal (−) with the voltage value of supply voltage VDD dropped through the resistor R12, diodes D1 and D2 and dividing the resistor R13 all connected in series to ground.

Here, if the output level of the first comparator CP1 is high, the output level of the second comparator CP2 becomes low, so that the high level output of CP1 is applied to the anode of the diode D3 to bias diode D3 into forward conduction and is conducted thereby to an input port P4 of the mono-stable oscillator 5a of the pulse generating stage 5, while, conversely, if the output of comparator CP2 is high level, it is passed to input port P4 of oscillator 5a through the diode D4.

Thereafter, the mono-stable oscillator 5a of the pulse generating stage 5 generates pulses in accordance with the signals outputted from the first and second comparators CP1 and CP2 of the comparator stage 4 and applies the pulses to the base of the transistor Q1 of the relay driving stage 7 its output terminal P6. Here, the transistor Q1 of the relay driving circuit 7 is turned on or off in accordance with the signals applied to its base.

Here, when the output from the mono-stable oscillator 5a is a high level pulse signal, the transistor Q1 which receives the high level signal at its base is turned on and then the supply voltage VDD is conducted through the relay coil RYC of the relay 6 to ground through the transistor Q1.

Thereafter, the relay switch RYS of the relay 6 is turned on and an instrument(not shown) is activated thereby.

Meanwhile, when the output from the mono-stable oscillator 5a is a low level signal, the transistor Q1 receiving the low level signal at its base is turned off. Thereafter, the supply voltage VDD from the relay coil RYC is applied to the light-emitting diode LED and then the light-emitting diode LED is lighted and the relay switch RYS is turned off.

However, the conventional infrared ray sensor driving circuit concurrently performs the filtering and amplifying, so that the gain of the amplifier and the cut-off frequency of the filter cannot easily be controlled. That is, if a resistance value is changed in order to change the gain of the amplifier, the cut-off frequency is changed thereby, and on the contrary, if the cut-off frequency of the filter is changed, the gain of the amplifier is changed thereby. In addition, since the filter exhibits only one pole, good performance for noise prevention cannot be obtained.

SUMMARY OF THE INVENTION

Accordingly, it is an improved object of the present invention to provide an infrared ray sensor driving circuit.

It is another object of the present invention to provide an improved infrared ray sensor driving circuit capable of advantageously controlling an amplifying level and a cut-off frequency of a filter by separating the function of an amplifier and a filter, respectively, so that the function of the amplifier and the filter for effectively detecting the human body detection signals by controlling the amplifying level of the amplifier and the cut-off frequency of the filter and for using the driving power of the other circuit by varying the amplifying ratio of the amplifier. In addition, using the 2-pole and 2-stage filter, the noise of a specific frequency is advantageously prevented.

To achieve the above objects, the infrared my sensor driving circuit according to the present invention includes an impedance matching circuit for detecting an infrared ray generated from a human body and for matching the impedance of the detected signals and the impedance of the infrared ray sensor driving circuit; a first amplifying circuit for amplifying a signal outputted from the impedance matching circuit to a predetermined level; a filtering circuit for filtering the signals outputted from the first amplifying circuit; and a second amplifying circuit for amplifying the signals outputted from the filtering circuit to a predetermined level.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and, thus, are not limitative of the present invention, and wherein.

DETAILED DESCRIPTION OF THE PREFERRED EMBODIMENTS

Figure 3:
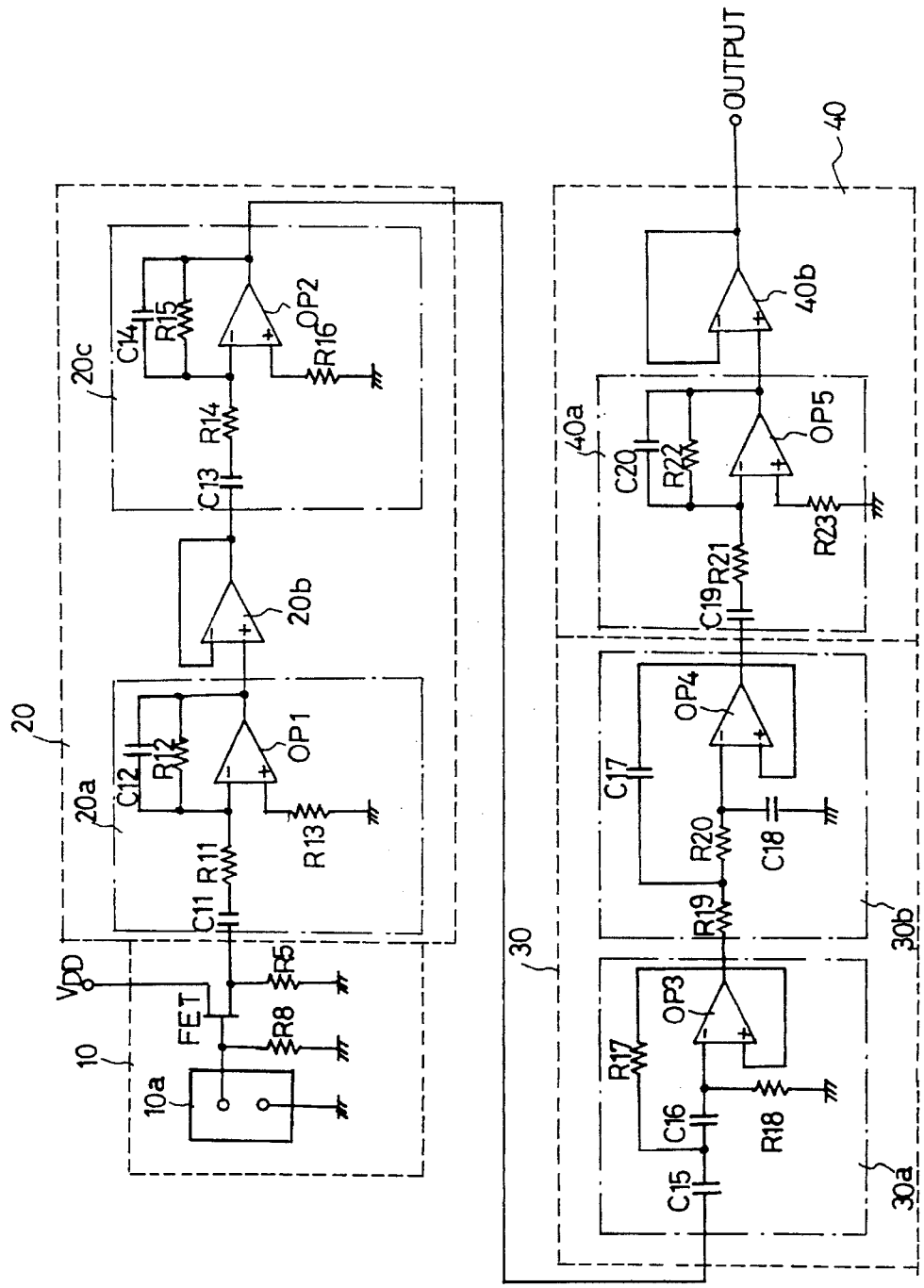
FIG. 3 is a block diagram showing an infrared ray sensor driving circuit according to an embodiment of the present invention.

Referring to FIG. 3, an infrared ray sensor driving circuit according to an embodiment of the present invention includes an impedance matching stage 10 including an infrared ray sensor 10a and a field effect transistor FET for convening an impedance of the detection signal of the infrared ray generated from the human body with the impedance of the infrared ray sensor driving circuit, a first amplifying stage 20 for amplifying the signals outputted from the impedance matching stage 10 by a predetermined gain, a filtering stage 30 for filtering the signals outputted from the first amplifying stage 20, and a second amplifying stage 40 for amplifying the signals outputted from the filtering stage 30.

The first amplifying stage 20 includes a pre-amplifying stage 20a having an operational amplifier OP1, condensers C11 and C12, and resistors R11 to R13 for pre-amplifying the signals outputted from the impedance matching stage 10, a first buffer stage 20b for buffering the signals outputted from the pre-amplifying stage 20a, and a first main amplifying stage 20c having an operational amplifier OP2, condensers C13 and C14, and resistors R14 to R16 for amplifying the signals outputted from the first buffer stage 20b.

The filtering stage 30 includes a high pass filter 30a having an operational amplifier OP3, condensers C15 and C16, and resistors R17 and R18 for filtering a predetermined low band component from the signals outputted from the first amplifying stage 20 and a low pass filter 30b having an operational amplifier OP4, condensers C17 and C18, and resistors R19 and R20 for filtering a predetermined high band component from the signals outputted from the high pass filter 30a.

The second amplifying stage 40 includes a second main amplifying stage 40a having an operational amplifier OP5, condensers C19 and C20, and resistors R21 to R23 for amplifying the signals outputted from the filtering stage 30 to a predetermined level and a second buffer stage 40b for buffering the signals outputted from the second amplifying stage 40a.

The detailed operation and effects of the infrared ray sensors driving circuit according to the present invention will now be explained.

To begin with, the infrared ray sensor 10a which detects the infrared signals generated from a human body applies the detected signals to the gate of a field effect transistor FET of the impedance matching stage 10.

Here, since the detection signal applied to its gate across gate resistance R8 is low in level and the impedance thereof is high, the field effect transistor converts the impedance of the detection signal and outputs a low impedance detection signal at its source terminal to the pre-amplifying stage 20a across a source resistance R5.

Thereafter, the coupling condenser C11 in the pre-amplifying stage 20a blocks the direct current components of the signal outputted from impedance matching stage 10 and inputted to the non-inverting terminal (+) of the operational amplifier OP1. Pre-amplifying stage 20a filters out high frequencies over about 3 Hz and invertingly amplifies the signal applied thereto by a predetermined gain of $1+[(\omega C11 \cdot R12)/(1+\omega C11 \cdot R11)(1-\omega C12 \cdot R12)]$ through the operational amplifier OP1.

The signals invertingly amplified through the operational amplifier OP1 are applied to the non-inverting terminal (+) of the operational amplifier configured for unity gain buffer and are buffered through the first buffer stage 20b and then are applied to the inverting input terminal (−) of the operational amplifier OP2 of the first main amplifying stage 20c.

Thereafter, the first main amplifying stage 20c invertingly amplifies the signals applied to the inverting input terminal (−) of the operational amplifier OP2 by a predetermined gain of $1+[(\omega C13 \cdot R15)/(1+\omega C13 \cdot R14)(1-\omega C14 \cdot R15)]$ through the operational amplifier OP2 and applies the amplified signals to filter stage 30.

Here, the signals outputted from the operational amplifier OP1 of the pre-amplifying stage 20a is buffered so that the impedance of the output signals of the operational amplifier OP1 cannot affect the values of the coefficients of the high pass filter 30a.

The signal outputted from the operational amplifier OP2 is applied to the input inverting terminal (−) of the operational amplifier OP3 of the high pass filter 30a through the serially connected condensers C15 and C16.

Thereafter, the high pass filter 30a filters the low band components from the signal applied to the inverting input terminal (−) of the operational amplifier OP3 in accordance with the values of the condensers C15 and C16, and resistors R17 and R18.

The signal outputted from the operational amplifier OP3 is applied to the input inverting terminal (−) of the operational amplifier OP4 through the serially connected resistors R19 and R20, and the condenser C18.

Thereafter, the low pass filter 30b filters the high band components from the signal applied to the inverting input terminal (−) of the operational amplifier OP4 in accordance with the values of the condensers C17 and C18, and the resistors R19 and R20.

Here, the frequency band width of the signal passed through the operational amplifier OP4 has a range of 1~3 Hz, similar to that of the human body.

Thereafter, the signal outputted from the operational amplifier OP4 is applied to the inverting input terminal (−) of the operational amplifier OP5 of the second main amplifying stage 40a through the serially connected condenser C19 and the resistor R21.

Thereafter, the second main amplifying stage 40a invertingly amplifies the signals applied to the inverting input terminal (−) of the operational amplifier OP5 by a predetermined gain of $1+[(\omega C19 \cdot R22)/(1+\omega C19 \cdot R21)(1-\omega C20 \cdot R22)]$. The signal outputted from the operational amplifier OP5 is applied to the non-inverting input terminal (+) of the operational amplifier configured as a unity gain buffer 40b and buffered thereby. The present invention advantageously separates the functions of the amplifier and the filter for effectively detecting the human body detection signals by controlling the amplifying level of the amplifier and the cut-off frequency of the filter and for using the driving power of the other circuit by varying the amplifying ratio of the amplifier. In addition, using the 2-pole and 2-stage filter, the noise of a specific frequency is advantageously prevented.

Figure 1:
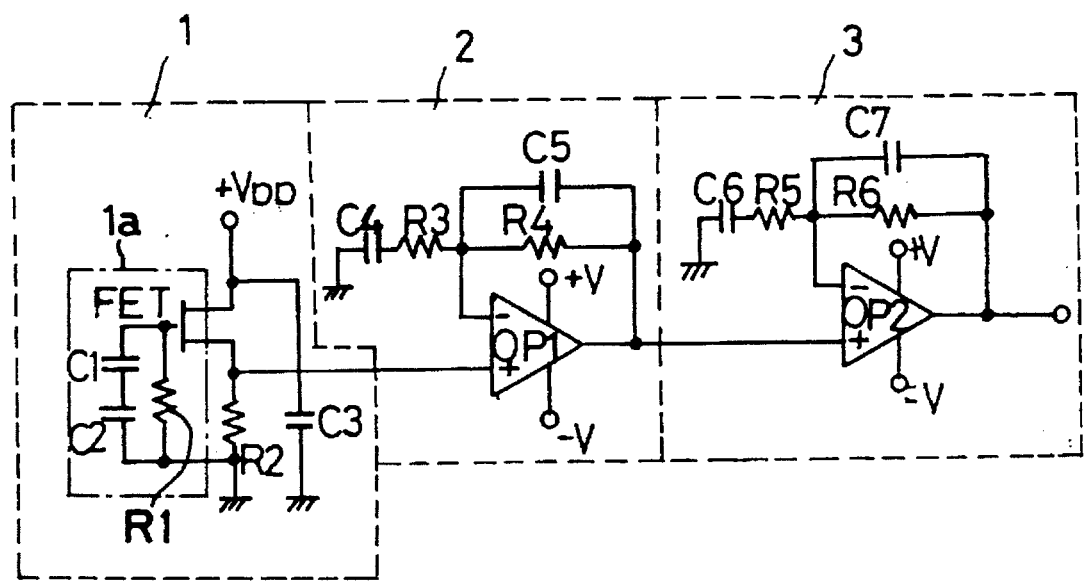
FIG. 1 is a block diagram showing a conventional infrared ray sensor driving circuit.
Figure 2:
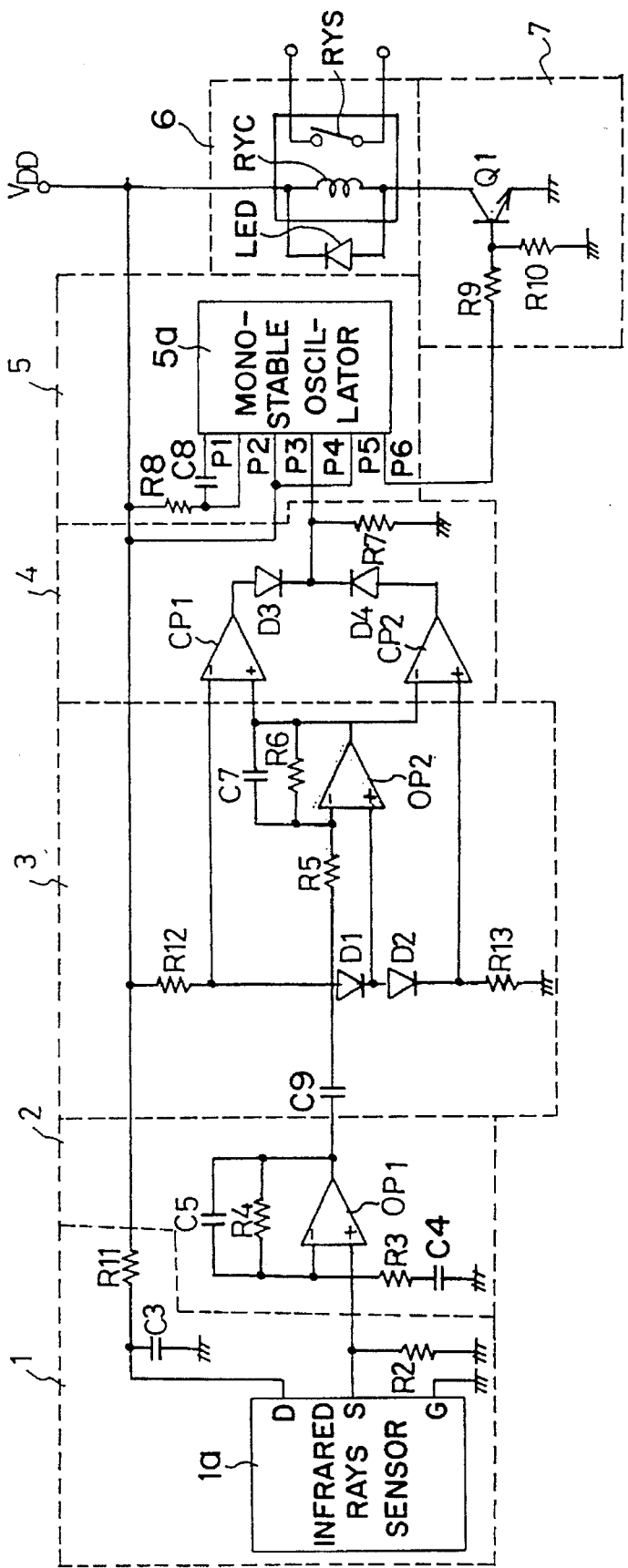
FIG. 2 is a block diagram showing a second conventional infrared ray sensor driving circuit.

The output signal from the second amplifying stage 40 may be applied to a comparator stage as in the conventional driving circuit of FIG. 2 in order to control a relay or the like for actuating an externally connected instrument or the like.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. An infrared ray sensor driving circuit for driving signals detected by an infrared ray sensor, comprising:

impedance matching means for converting a high impedance of signals detected by the infrared ray sensor to a low impedance signal;

first amplifying means for amplifying a signal outputted from the impedance matching means by a first predetermined gain, buffering the amplified signal to decrease impedance thereof, and amplifying the buffered signal by a second predetermined gain;

filtering means for filtering the signal outputted from the first amplifying means to pass frequencies of a predetermined band width; and second amplifying means for amplifying the signal outputted from the filtering means by a third predetermined gain.

2. The infrared ray sensor driving circuit of claim 1, wherein said first amplifying means includes pre-amplifying means for pre-amplifying an AC component of the signal outputted from the impedance matching means by the first predetermined gain, first buffer means for buffering the signal outputted from the pre-amplifying means, and first main amplifying means for amplifying the signal outputted from the first buffer means by said second predetermined gain.

3. The infrared ray sensor driving circuit of claim 1, wherein said filtering means includes high pass filter means for filtering a predetermined low band component of the signal outputted from the first amplifying means and a low pass filter means for filtering a predetermined high band component of the signal outputted from the high pass filter means.

4. The infrared ray sensor driving circuit of claim 3, wherein said high pass filter means and said low pass filter means form a band pass filter for passing frequencies having a range of 1~3 Hz from the signal outputted from the first amplifying means.

5. The infrared ray sensor driving circuit of claim 1, wherein said second amplifying means includes main amplifying means for amplifying the signal outputted from the filtering means by said third predetermined gain and buffer means for buffering the signal outputted from the main amplifying means.

6. A circuit for driving a signal detected by a infrared ray sensor, comprising:

an impedance matching circuit for generating a low impedance signal based on the signal detected by the infrared ray sensor;

a preamplifying circuit for amplifying the low impedance signal by a first predetermined gain;

a first buffer circuit for buffering the pre-amplified low impedance signal to generate a first buffer signal;

a first amplifying circuit for amplifying the first buffer signal by a second predetermined gain;

a high-pass filter for filtering a low frequency portion of the amplified signal from the first amplifying circuit;

a low-pass filter for filtering a high frequency portion of the filtered signal from the high-pass filter;

a second amplifying circuit for amplifying the filtered signal from the low-pass filter by a third predetermined gain; and a second buffer circuit for buffering the amplified signal from the second amplifying circuit to generate an output signal based on the signal detected by the infrared ray sensor.

7. The circuit of claim 6, wherein each of said preamplifying circuit, said first amplifying circuit, said high-pass filter, said low-pass filter and said second amplifying circuit includes an operational amplifier, a plurality of resistors and a plurality of condensers.

8. The circuit of claim 6, wherein said high-pass filter and said low-pass filter pass frequencies having a range of 1–3 $H_z$ from the signal output from the first amplifying circuit.

9. The circuit of claim 6, wherein said impedance matching circuit includes the infrared ray sensor and a field effect transistor.

* * * * *